(12) United States Patent
Andreev et al.

(10) Patent No.: US 9,941,430 B2
(45) Date of Patent: Apr. 10, 2018

(54) SILICON-BASED QUANTUM DOT DEVICE

(71) Applicant: HITACHI, LTD., Chiyoda-ku, Tokyo (JP)

(72) Inventors: Aleksey Andreev, Cambridgeshire (GB); David Williams, Cambridgeshire (GB); Ryuta Tsuchiya, Cambridgeshire (GB); Yuji Suwa, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 15/442,113

(22) Filed: Feb. 24, 2017

(65) Prior Publication Data
US 2017/0288076 A1 Oct. 5, 2017

(30) Foreign Application Priority Data

Mar. 31, 2016 (EP) .................... 16163414

(51) Int. Cl.
*H01L 29/06* (2006.01)
*H01L 31/0352* (2006.01)
(Continued)

(52) U.S. Cl.
CPC ... *H01L 31/035218* (2013.01); *G06N 99/002* (2013.01); *H01L 29/0649* (2013.01);
(Continued)

(58) Field of Classification Search
CPC ... B82Y 10/00; B82Y 30/00; H01L 29/66439; H01L 29/66469; H01L 29/7613; H01L 29/0665; H01L 29/7803; H01L 29/405; H01L 29/407; H01L 29/0869; H01L 29/0865; H01L 29/7811; H01L 29/7813; H01L 29/66734; H01L 23/5226; H01L 23/552; H01L 29/0696; G11C 2216/08; Y10S 977/89; Y10S 977/895; Y10S 977/937; Y10S 977/774
See application file for complete search history.

(56) References Cited

U.S. PATENT DOCUMENTS 5,714,766 A 2/1998 Chen et al.
6,774,014 B1 * 8/2004 Lee ........................ B82Y 10/00
257/E21.09
(Continued)

FOREIGN PATENT DOCUMENTS

EP 2 075 745 A1 7/2009
WO WO 02/073527 A2 9/2002

OTHER PUBLICATIONS

Goswami, Srijit et al.; "Controllable Valley Splitting in Silicon Quantum Devices"; Nature Physics, vol. 3; pp. 41-45; 2007.
Zhang, Lijun et al.; "Genetic Design of Enhanced Valley Splitting towards a Spin Qubit in Silicon"; Nature Communications; vol. 4; 2396; 2013.
(Continued)

*Primary Examiner* — Roy Potter
(74) *Attorney, Agent, or Firm* — Miles & Stockbridge P.C.

(57) ABSTRACT

A silicon-based quantum dot device (1) is disclosed. The device comprises a substrate (8) and a layer (7) of silicon or silicon-germanium supported on the substrate which is configured to provide at least one quantum dot ($5_1$, $5_2$: FIG. 5). The layer of silicon or silicon-germanium has a thickness of no more than ten monolayers. The layer of silicon or silicon-germanium may have a thickness of no more than eight or five monolayers.

15 Claims, 6 Drawing Sheets

(51) Int. Cl.
*H01L 31/028* (2006.01)
*H01L 31/024* (2014.01)
*H01L 33/06* (2010.01)
*H01L 33/34* (2010.01)
*H01L 33/64* (2010.01)
*H01L 31/112* (2006.01)
*H01L 33/00* (2010.01)
*G06N 99/00* (2010.01)
*B82Y 10/00* (2011.01)
*B82Y 20/00* (2011.01)

(52) U.S. Cl.
CPC .......... *H01L 31/024* (2013.01); *H01L 31/028* (2013.01); *H01L 31/112* (2013.01); *H01L 33/0041* (2013.01); *H01L 33/06* (2013.01); *H01L 33/34* (2013.01); *H01L 33/64* (2013.01); *B82Y 10/00* (2013.01); *B82Y 20/00* (2013.01); *Y10S 977/774* (2013.01); *Y10S 977/814* (2013.01); *Y10S 977/933* (2013.01); *Y10S 977/95* (2013.01); *Y10S 977/954* (2013.01)

(56) References Cited

U.S. PATENT DOCUMENTS

| | | | |
|---|---|---|---|
| 8,076,217 B2* | 12/2011 | Kruglick | B82Y 10/00 438/478 |
| 9,245,896 B2* | 1/2016 | Afzali-Ardakani | H01L 27/11521 |
| 9,520,573 B2* | 12/2016 | Zhou | H01L 51/4233 |
| 2009/0101888 A1 | 4/2009 | Song et al. | |

OTHER PUBLICATIONS

Noborisaka, J. et al.; "Electric Tuning of Direct-Indirect Optical Transitions in Silicon"; Scientific Reports; Article No. 6950; 2014.
Park S. H. et al.; "Theoretical Studies on Intervalley Splittings in Si/SiOquantum Dot Structures"; The European Physical Journal B; vol. 85; No. 1; Jan. 18, 2012; pp. 1-4.
Extended European Search Report issued in the corresponding European Patent Application No. 16163414.2.

* cited by examiner

SILICON-BASED QUANTUM DOT DEVICE

FIELD OF THE INVENTION

The present invention relates to a silicon-based quantum dot device, in particular to a silicon-based quantum information processing device.

BACKGROUND

Silicon-based quantum information processing devices, such as those described in EP 2 075 745 A1, can offer many advantages, such as scalability and ease of fabrication. However, the multi-valley character of the conduction band structure in silicon suffers a drawback because it can be difficult to create an electron state in a silicon quantum dot that is sufficiently separated from other states due to small intervalley splitting. Usually this splitting is much smaller than 1 meV and reports show that it is extremely difficult to increase this splitting even up to 10 meV. Different ways have been proposed to increase the splitting from a usual value in the range of 0.01 to 0.1 meV to up to 1 meV and to 10 meV. For example, Srijit Goswami et. al.: "Controllable valley splitting in silicon quantum devices", Nature Physics, volume 3, pages 41 to 45 (2007) proposes a scheme which uses rough silicon/silicon germanium interfaces to increase splitting up to 1.5 meV and Lijun Zhang et. al.: "Genetic Design of Enhanced Valley Splitting towards a Spin Qubit in Silicon", Nature Communications, volume 4, 2396 (2013) proposes a scheme to increase the splitting to up to 9 meV by using a specific sequence of silicon and germanium layers. Reference is also made to J. Noborisaka, K. Nishiguchi & A. Fujiwara: "Electric tuning of direct-indirect optical transitions in silicon", Scientific Reports, Article number: 6950 (2014).

Small intervalley splitting has the potential to limit the use of silicon-based quantum information processing devices (as well as other types of silicon-based devices employing quantum dots) at high temperatures, in particular at room temperature, and even at a low temperatures, for example temperatures at or below 4.2 K.

SUMMARY

The present invention seeks to increase intervalley splitting in a silicon-based quantum dot device.

According to a first aspect of the present invention there is provided a silicon-based quantum dot device comprising a substrate and a layer of silicon or silicon-germanium supported on the substrate configured to provide at least one quantum dot. The layer of silicon or silicon-germanium has a thickness of no more than ten monolayers. The layer of silicon preferably has a thickness of no more than eight monolayers and, even more preferably, no more than five monolayers.

Thus, by using a thin layer of silicon or silicon-germanium, intervalley splitting can be increased from less than 1 meV to well over 100 meV and, thus, help to isolate quantum dot states.

Preferably, the layer of silicon or silicon-germanium is monocrystalline. The layer of silicon or silicon-germanium may be laterally polycrystalline, i.e. comprising regions which are single crystal between upper and lower interfaces of the layer.

The layer of silicon or silicon-germanium is preferably undoped. For example, the layer of silicon or silicon-germanium may have a (background) impurity density of no more than $10^{15}$ cm$^{-3}$ or no more than $10^{14}$ cm$^{-3}$. The layer of silicon or silicon-germanium may be doped, for example, n-type or p-type. A dopant atom may be configured (for example, by virtue of element, crystal position and/or position relative to interface(s)) so as not to provide any effective confinement potential. Alternatively, a dopant atom may be configured so as to provide a confinement potential, for example, in-plane (or "laterally").

The layer of silicon or silicon-germanium has a thickness of at least one monolayer, at least two monolayer or at least three monolayers. The layer of silicon preferably has a thickness of three, four or five monolayers.

The layer of silicon or silicon-germanium may comprise an isolated region of silicon having lateral dimensions (e.g. length and width) which are no more than 100 nm.

The device may comprise first and second layers of dielectric material and the layer of silicon or silicon-germanium may be interposed between the first and second layers of dielectric material and be in direct contact with the first and second layers of dielectric material. The first and/or second layers of dielectric material may comprise silicon dioxide. However, other dielectric materials, such a silicon nitride or high-k dielectrics may be used for one or both dielectric layers. A first layer of dielectric material may be a buried oxide layer. The second layer of dielectric material may be a thermal or naturally-forming oxide.

The layer of silicon or silicon-germanium may be configured to provide at least one isolated double quantum dot.

The layer of silicon or silicon-germanium may comprise a plurality of regions which are spaced apart, which are electrically isolated from each other and which provide at least one quantum dot system, at least one gate and at least one electrometer.

The device may further comprise at least one electrometer arranged to measure charge or charge distribution in the at least one quantum dot. The device may further comprise at least one at least one gate arranged to apply an electric field to the at least one quantum dot. For example, the device may comprise two isolated double quantum dots and the device may comprise four, six or eight gates for applying electric fields to the two isolated double quantum dots, for example, for performing qubit transformations.

The device may be a quantum information processing device. Thus, a quantum dot or a double quantum dot can provide a qubit.

The device may be a photon source and/or a photon detector.

According to a second aspect of the present invention there is provided apparatus comprising a device according to the first aspect of the invention, an optional refrigerator for cooling the device to a temperature equal to or less than 4.2° K. and circuitry for applying biases to the device, for example, for initialising a qubit, performing a qubit transformation and reading out a final state of the qubit.

BRIEF DESCRIPTION OF THE DRAWINGS

Certain embodiments of the present invention will now be described, by way of example, with reference to the accompanying drawings, in which:

FIG. 1b shows a quantum well formed by the ultra-thin layer shown in FIG. 1a;

DETAILED DESCRIPTION OF CERTAIN EMBODIMENTS

Figure 1A:
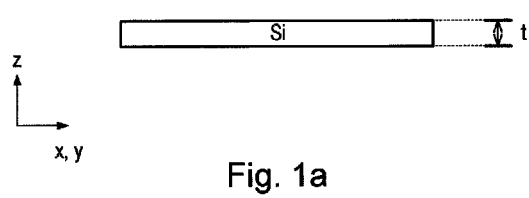
FIG. 1a illustrates an ultra-thin layer of silicon.
Figure 1B:
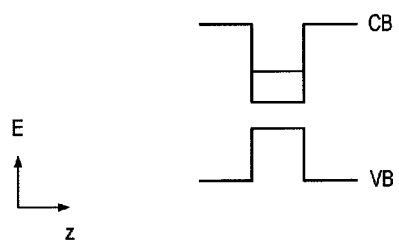

Referring to FIG. 1a, the band structure of a layer of silicon is modelled using density functional theory (DFT) and a 30×30 k.p band structure models. Referring also to FIG. 1b, if the layer of silicon is sufficiently thin, then a quantum well is formed.

The DFT model uses a generalized gradient approximation employing plane-wave-based ultrasoft pseudopotentials. The model is the same as that described in Yuji Suwa and Shin-ichi Saito: "Intrinsic optical gain of ultrathin silicon quantum wells from first-principles calculations", Physical Review B, volume 79, page 233308 (2009) which is incorporated herein by reference.

The 30×30 k.p model gives an accurate description of silicon bulk band structure in the whole Brillouin zone in an energy range from −4 eV to +4 eV (where 0 eV corresponds to the valence band edge). The wavefunctions of the carriers in a silicon thin quantum well is expanded as a superposition of bulk plane waves and the coefficients of the expansion are found numerically from the solution of the eigenvalue problem resulted from corresponding Schrödinger equation with 30×30 kp effective Hamiltonian:

$$\Psi(r) \sum_{k_z} \sum_{\alpha=1}^{N_H} C_\alpha(k_{//}, k_z) \exp(ik_z + ik_{//} r_{//}) u_\alpha(r) \quad (1)$$

where z is perpendicular to the silicon layer and the summation is carried over all basis states described by Bloch functions $u_\alpha$ (r), $\alpha=1, 2, \ldots, N_H=30$ over all possible z-components $k_z$ of the wavevector $(k_{||}, k_z)$ inside the Brillion zone. Reference is made to D. Rideau et al: "Strained Si, Ge, and $Si_{1-x}Ge_x$ alloys modeled with a first-principles-optimized full-zone k·p method", Physical Review B, volume 74, page 195208 (2006) and A. D. Andreev, R. A. Surfs: "Nearly free carrier model for calculating the carrier spectrum in heterostructures", Semiconductors, volume 30, pages 285 to 292 (1996).

Figure 2:
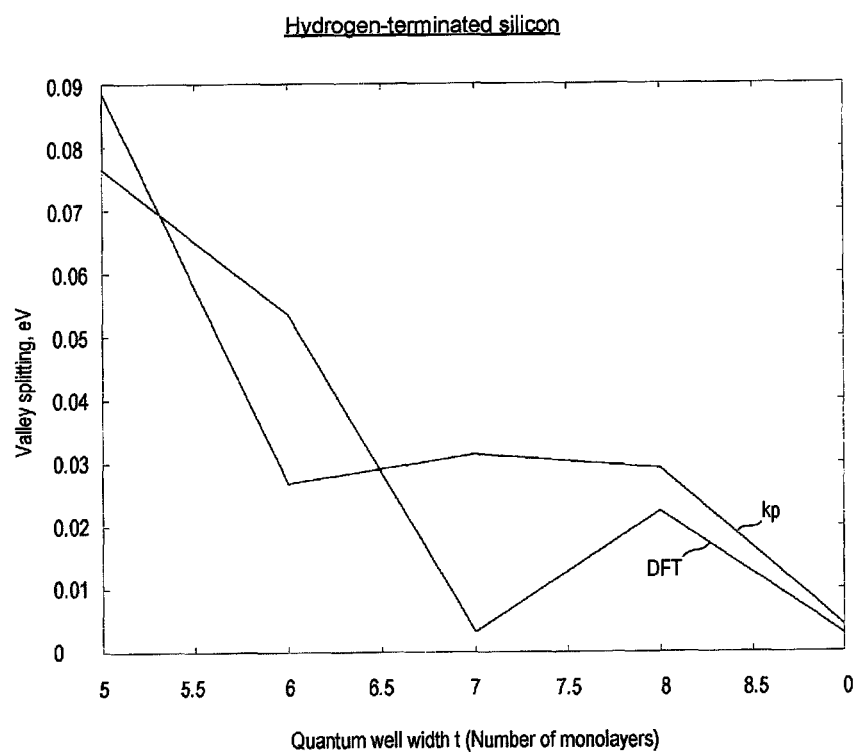
FIG. 2 shows plots of valley splitting against number of monolayers for a silicon quantum well comprising a layer of silicon having surfaces terminated with hydrogen calculated using a density functional theory (DFT) model and a 30×30 multi-band envelope wavefunction model (k.p) model.

FIG. 2 shows plots of calculated valley splitting in silicon quantum well using DFT and 30×30 kp methods for hydrogen-terminated silicon. It is clear that the intervalley splitting significantly increases when layer thickness (i.e. quantum well width) decreases, particularly when the layer thickness is five monolayers.

Figure 3:
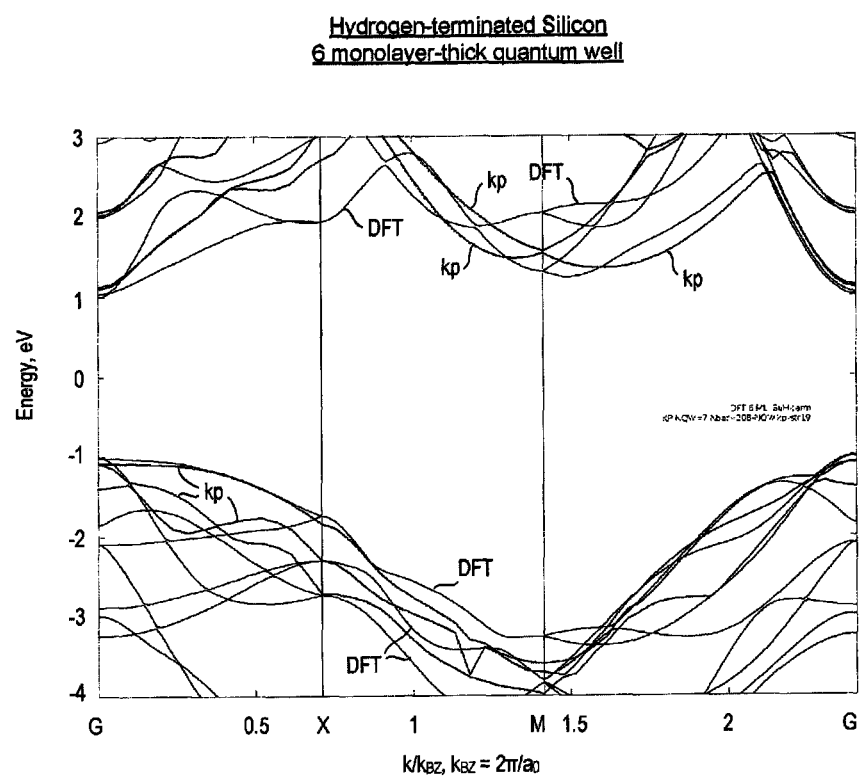
FIG. 3 shows a band structure a layer of silicon having a thickness of six monolayers and surfaces terminated with hydrogen calculated using a DFT model and a 30×30 k.p model.

FIG. 3 shows the calculated band diagram for a silicon quantum dot formed by a layer of silicon which is six monolayers thick. Both models give similar results.

Figure 4:
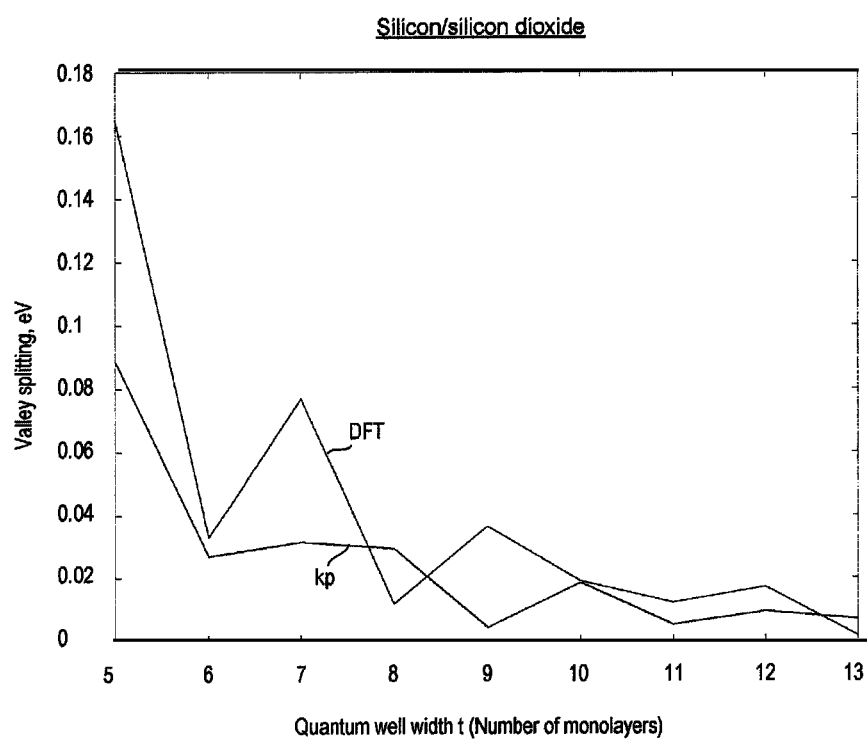
FIG. 4 shows plots of valley splitting against number of monolayers for a silicon quantum well comprising a layer of silicon embedded in silicon dioxide calculated using a DFT model and a 30×30 k.p model.

FIG. 4 shows plots of calculated valley splitting in a silicon quantum well comprising a layer of silicon sandwiched between silicon dioxide using DFT and 30×30 kp methods. It is clear that if the layer of silicon is five monolayers thick, then the splitting between electrons in different valleys can be increase by up to 160 to 180 meV.

Without wishing to be bound by theory, the thin layer is thought to push electrons to the surface/interface. This is thought to increase the interface-related electric field averaged over the electron wavefunction squared modulus. A thicker layer, with a rougher surface, is thought not allow proper localization of electrons. Instead, electrons break it into small pockets.

EP 2 075 745 A1 (which is incorporated herein by reference) describes a quantum information processing device. The devices described therein comprise a layer of silicon having a thickness equal to or less than about 50 nm patterned to form regions of silicon which provide isolated double quantum dots. If the layer of silicon is made sufficiently thin and its surfaces are atomically flat, then inter-valley splitting in these devices can be increased significantly.

EP 1 860 600 A1 and EP 2 264 653 A1 (which are incorporated herein by reference) describe similar devices which can be modified by using a layer of silicon no more than five monolayers thick.

An example of a quantum information processing device will be briefly described with reference to FIGS. 5 and 6. However, details regarding fabrication, device layout and operation can be found in EP 2 075 745 A1 ibid.

Figure 5:
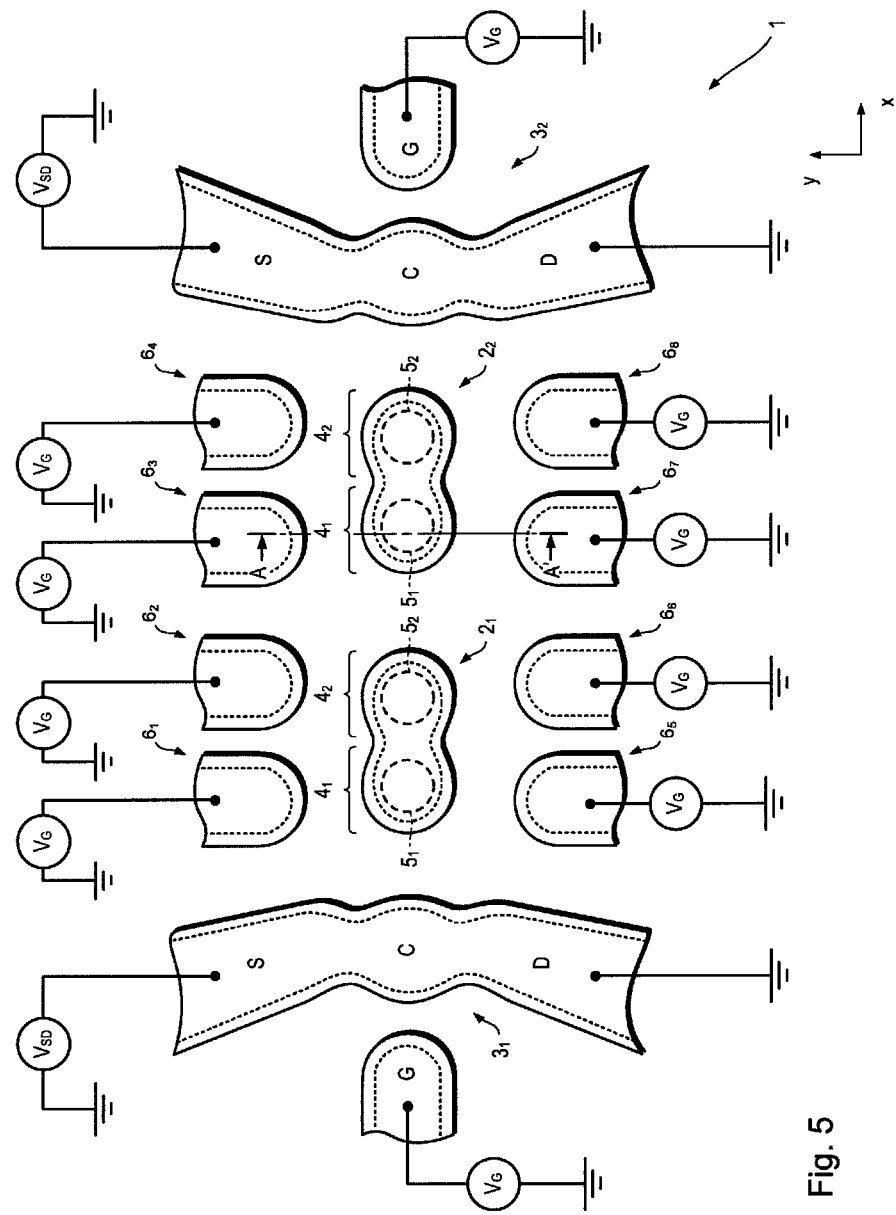
FIG. 5 is a plan view of silicon-based quantum information processing device comprising two isolated double quantum dots.
Figure 6:
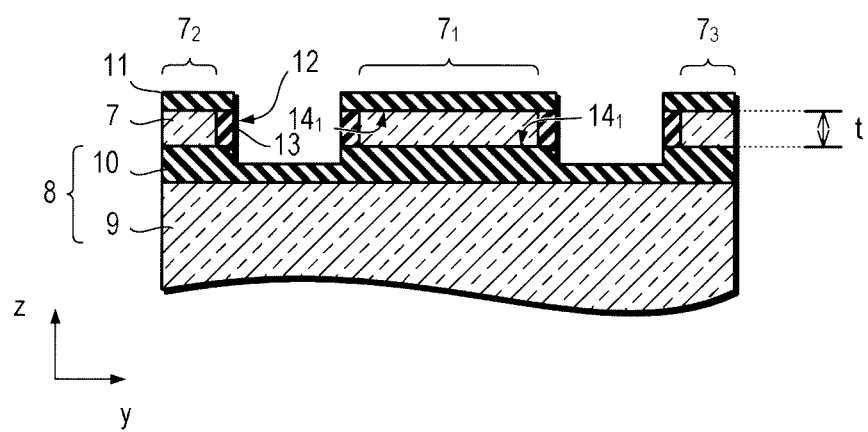
FIG. 6 is a cross sectional view of the silicon-based quantum information processing device shown in FIG. 5 taken along the line A-A'.

Referring to FIGS. 5 and 6, the quantum information processing device 1 comprises first and second isolated double quantum dot systems 21, 22 which are arranged end-to-end at near ends and which are capacitively coupled (at their far ends) to first and second single-electron transistors $3_1$, $3_2$ respectively. Each isolated quantum dot systems $2_1$, $2_2$ has first and second lobes $4_1$, $4_2$ which house first and second quantum dots respectively $5_1$, $5_2$. The device 1 includes a plurality of side gates $6_1$, $6_2$, . . . , $6_8$ for controlling operation of the isolated quantum dot systems $2_1$, $2_2$. The first and second single-electron transistors $3_1$, $3_2$ include source S, drain D and channel C, which includes one or more conductive islands, and side gates G. Lateral dimensions can be found in EP 2 075 745 A1 ibid.

Referring in particular to FIG. 6, the isolated quantum dot systems $2_1$, $2_2$, single-electron transistors $3_1$, $3_2$ and side gates $6_1$, $6_2$, . . . , $6_8$ are formed in an ultrathin layer of silicon 7, i.e. a layer of silicon having a thickness, t, which is no more than five monolayers thick. The ultrathin layer of silicon 7 is supported on a substrate 8 comprising a silicon base 9 and an overlying layer 10 of silicon dioxide. The layer of silicon 7 is covered by a layer 11 of silicon dioxide. The layer of silicon 7 is divided into regions $7_1$, $7_2$, $7_3$ by sidewalls 12 and flanking regions 13 of silicon dioxide. Details regarding fabrication can be found in EP 2 075 745 A1 ibid.

The silicon layer 7 is monocrystalline. The surface of the silicon layer 7 lies in the (100) crystal plane. However other crystal orientations are also possible provided that the surface roughness is sufficiently low. The layer 7 is obtained by patterning a silicon-on-insulator wafer (not shown). Different fabrication methods may be used to form suitably thin layers, e.g. by sacrificially growing an oxide layer or by depositing a dielectric layer on a suitably thin layer of silicon.

The silicon layer 7 can be obtained by sacrificially growing an oxide layer, starting from a thicker layer of silicon, using a thermal oxidation process. The thermal oxidation process can form a uniform silicon dioxide layer with small thickness variability. The thickness is controlled by the starting thickness and the oxidation time. Reference is made to K. Uchida et al: "Experimental Study on Carrier Transport Mechanisms in Double- and Single-Gate Ultrathin-Body MOSFETs—Coulomb Scattering, Volume Inversion, and δTSOI-induced Scattering—". Technical Digest of International Electron Devices Meeting (IEDM) Washington D.C., pages 805 to 808 (2003).

Interfaces $14_1$, $14_2$ between silicon 7 and silicon dioxide 10, 11 are smooth, i.e. having a root mean square (rms) surface roughness of no more than two monolayers and which preferably is no more 20% of the layer thickness, more preferably no more than 5% of the layer thickness and even more preferably no more than 2% of the layer thickness. Thus, for a layer having a thickness of five monolayers, the rms surface roughness is preferably no more than one monolayer, more preferably no more than 0.2 monolayers and even more preferably no more than 0.1 monolayers. For a layer having a thickness of four monolayers, the rms surface roughness is preferably no more than 0.8 monolayers, more preferably no more than 0.2 monolayers and even more preferably no more than 0.1 monolayers. For a layer having a thickness of three monolayers, the rms surface roughness is preferably no more than 0.6 monolayers, more preferably no more than 0.15 monolayers and even more preferably no more than 0.06 monolayers. Even more preferably the interfaces $14_1$, $14_2$ are substantially flat.

A set of voltage sources $13_1$, $13_2$, . . . , $13_n$ are used to apply biases to the side gates $6_1$, $6_2$, . . . , $6_8$ and the single-electron transistors $3_1$, $3_2$. A method of operating the device 1 can be found in EP 2 075 745 A1 ibid.

It will be appreciated that many modifications may be made to the embodiments hereinbefore described.

For example, the device can be a silicon-based photon source and/or detector comprising one or more quantum dots.

Other dielectric materials can be used, such as silicon nitride. Other gate arrangements, e.g. top gate, bottom gate etc., can be used.

Instead of silicon, the layer may comprise silicon-germanium ($Si_{1-x}Ge_x$), where x>0, for example, in the range 0.01 to 0.2.

The silicon or silicon-germanium layer may be strained.

The invention claimed is:

1. A silicon-based quantum dot device comprising:
a substrate; and
a layer of silicon or silicon-germanium supported on the substrate configured to provide at least one quantum dot,
wherein the layer of silicon or silicon-germanium has a thickness of no more than ten monolayers, and
wherein the layer of silicon or silicon-germanium is further configured to provide at least one isolated double quantum dot.

2. A device according to claim 1, wherein the layer of silicon or silicon-germanium has a thickness no more than eight monolayers.

3. A device according to claim 1, wherein the layer of silicon or silicon-germanium has a thickness of at least three monolayers.

4. A device according to claim 1, wherein the layer of silicon or silicon-germanium has a thickness of three, four or five monolayers.

5. A device according to claim 1, wherein the layer of silicon or silicon-germanium has a root mean square surface roughness of no more than 2 monolayers and no more than 20% of the thickness of the layer.

6. A device according to claim 1, wherein the layer of silicon or silicon-germanium comprises an isolated region of silicon or silicon-germanium having lateral dimensions, each lateral dimension being no more than 100 nm.

7. A device according to claim 1, further comprising:
first and second layers of dielectric material;
wherein the layer of silicon or silicon-germanium is interposed between the first and second layers of dielectric material and is in direct contact with the first and second layers of dielectric material.

8. A device according to claim 7, wherein the first and/or second layers of dielectric material comprise silicon dioxide.

9. A device according to claim 1, wherein the layer of silicon or silicon-germanium comprises a plurality of regions which are spaced apart, which are electrically isolated from each other and which provide at least one quantum dot system, at least one gate and at least one electrometer.

10. A device according to claim 1, further comprising:
at least one electrometer arranged to measure charge distribution in the at least one quantum dot.

11. A device according to claim 1, further comprising:
at least one gate arranged to apply an electric field to the at least one quantum dot.

12. A device according to claim 1, wherein the device is a quantum information processing device.

13. A device according to claim 1, wherein the device is a photon source or a photon detector.

14. An apparatus comprising:
a device according to claim 1;
a refrigerator for cooling the device to a temperature equal to or less than 4.2° K; and
circuitry for applying biases to the device.

15. The device according to claim 2, wherein the layer of silicon or silicon-germanium has a thickness no more than five monolayers.

* * * * *